(12) United States Patent
Gutch et al.

(10) Patent No.: US 10,222,079 B2
(45) Date of Patent: Mar. 5, 2019

(54) BATTERY-POWERED CONTROL DEVICE

(71) Applicant: British Gas Trading Limited, Windsor, Berkshire (GB)

(72) Inventors: John Gutch, Grays (GB); John Mulcahy, Flitton (GB); Yves Béhar, San Francisco, CA (US); Noah Murphy-Reinhertz, San Francisco, CA (US); Moonchul Kim, San Francisco, CA (US); Mirko Ihrig, San Francisco, CA (US)

(73) Assignee: British Gas Trading Limited, Windsor (GB)

( * ) Notice: Subject to any disclaimer, the term of this patent is extended or adjusted under 35 U.S.C. 154(b) by 189 days.

(21) Appl. No.: 14/735,693

(22) Filed: Jun. 10, 2015

(65) Prior Publication Data

US 2016/0363342 A1 Dec. 15, 2016

(51) Int. Cl.
*H05K 5/02* (2006.01)
*F24F 11/30* (2018.01)
(Continued)

(52) U.S. Cl.
CPC .............. *F24F 11/30* (2018.01); *F24F 11/89* (2018.01); *G01D 11/24* (2013.01); *G01D 11/30* (2013.01);
(Continued)

(58) Field of Classification Search
None
See application file for complete search history.

(56) References Cited

U.S. PATENT DOCUMENTS

| 4,870,395 A | 9/1989 | Belano |
| 5,969,600 A * | 10/1999 | Tanguay ............. G08B 29/181 340/438 |

(Continued)

FOREIGN PATENT DOCUMENTS

WO 2009/082246 A1 7/2009

OTHER PUBLICATIONS

PCT International Search Report and Written Opinion from International Application No. PCT/GB2016/051707, dated Nov. 8, 2016, 20 pages.

*Primary Examiner* — Courtney Smith
*Assistant Examiner* — Jessey R Ervin
(74) *Attorney, Agent, or Firm* — Tucker Ellis LLP; Michael G. Craig

(57) ABSTRACT

A battery-powered environmental control and/or sensor device is disclosed. The device includes a mounting plate arranged to be affixed to a support surface; and a main body including a battery compartment. The main body is adapted to be releasably secured to the mounting plate, with the battery compartment being substantially inaccessible when the main body is secured to the mounting plate. The mounting plate and main body comprise complementary securing elements arranged to secure the main body to the mounting plate. The mounting plate or the main body include a lever having a portion extending beyond a periphery of the device so as to be operable by a device user when the main body is secured to the mounting plate. The lever is operable when activated to disengage the complementary securing elements and separate the main body from the mounting plate to provide access to the battery compartment.

11 Claims, 4 Drawing Sheets

Figure 1:
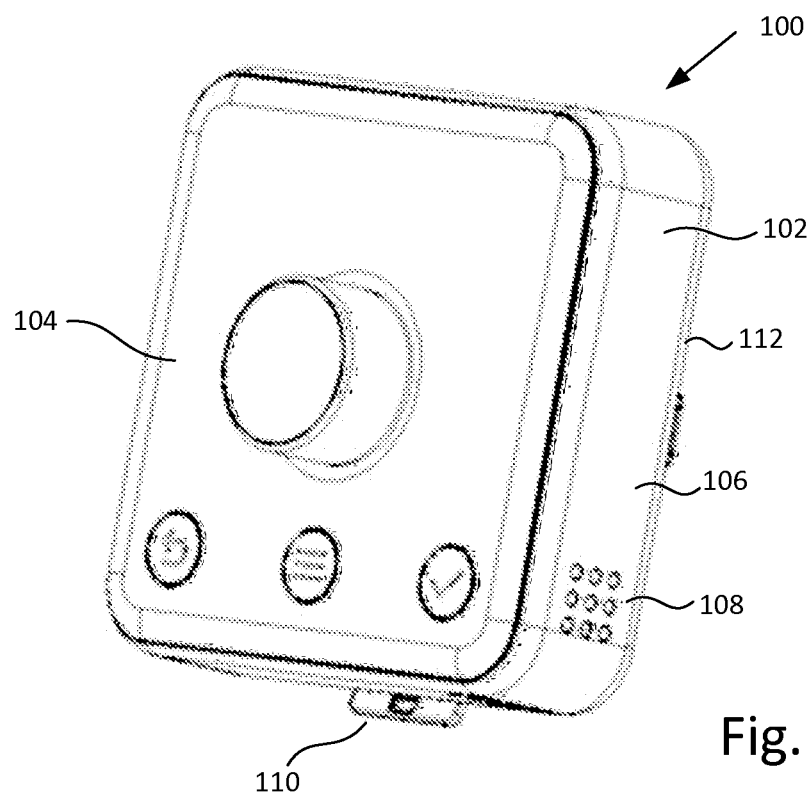

(51) Int. Cl.
*G01D 11/24* (2006.01)
*G01D 11/30* (2006.01)
*F24F 11/89* (2018.01)
*F24F 11/52* (2018.01)

(52) U.S. Cl.
CPC ......... *H05K 5/0204* (2013.01); *H05K 5/0239* (2013.01); *F24F 11/52* (2018.01)

(56) References Cited

U.S. PATENT DOCUMENTS

| | | | | |
|---|---|---|---|---|
| 6,017,375 | A | * | 1/2000 | Duell ................ F24F 13/20 55/356 |
| 6,160,487 | A | | 12/2000 | DeLuca |
| 7,414,538 | B2 | * | 8/2008 | Cook ................ G08B 17/10 340/628 |
| 7,662,507 | B2 | * | 2/2010 | Schwendinger .... H01M 2/1044 220/324 |
| 2003/0026415 | A1 | * | 2/2003 | Laetsch .............. H05K 7/20445 379/338 |
| 2007/0039472 | A1 | * | 2/2007 | Bias ................ B03C 3/025 96/66 |
| 2012/0130546 | A1 | * | 5/2012 | Matas ................ F24F 11/0012 700/276 |

* cited by examiner

BATTERY-POWERED CONTROL DEVICE

BACKGROUND

For a long time thermostats for central heating systems were relatively simple devices, providing basic functionality for controlling the temperature in an environment and connected to a central heating boiler via a wired connection.

Recently, more advanced devices have been developed, which provide more flexible control over central heating systems and can, in some cases, be remotely controlled, for example using an application on a tablet computer or smartphone. Furthermore, some wireless designs no longer require a wired connection to the boiler, instead communicating wirelessly with a receiver device connected to the boiler, which affords much greater flexibility in where the thermostat can be installed. For convenience, such devices may be battery-powered, but the power needs are typically much greater than for other types of domestic environmental sensors, such as smoke alarms, which typically only require batteries to be changed very infrequently. In such cases, it does not matter greatly if the device is constructed in such a way that access to the battery is fiddly or difficult (e.g. requiring a screwdriver). However, such constructions are less suitable for devices like wireless thermostats, where batteries need to be replaced more frequently.

Wireless devices also have the advantage of allowing installation in more convenient locations, where they are more accessible and hence typically also more visible. Users may therefore prefer to have devices whose appearance suits the environment in which they are installed. However, producing thermostats in a variety of designs to meet user needs significantly increases manufacturing costs.

SUMMARY

The present invention seeks to alleviate some of the above problems.

The present invention relates to an environmental control and/or sensor device, such as a thermostat.

Accordingly, in a first aspect of the invention, there is provided a battery-powered environmental control and/or sensor device adapted to be mounted on a surface, comprising: a mounting plate arranged to be affixed to a support surface; and a main body including a battery compartment, wherein the main body is adapted to be releasably secured to the mounting plate and wherein the battery compartment is inaccessible when the main body is secured to the mounting plate; wherein the mounting plate and main body comprise complementary securing elements arranged to secure the main body to the mounting plate; wherein one of the mounting plate and the main body includes a lever having a portion extending beyond a periphery of the device so as to be operable by a device user when the main body is secured to the mounting plate; and wherein the lever is operable when activated to disengage the complementary securing elements and release the main body from the mounting plate to enable access to the battery compartment.

DRAWINGS

Preferred features of the present invention will now be described, purely by way of example, with reference to the accompanying drawings, in which:—

Figure 2:
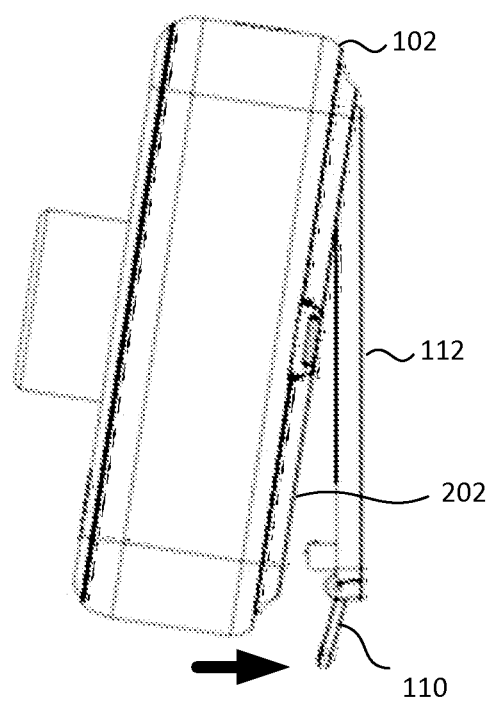
Figure 3:
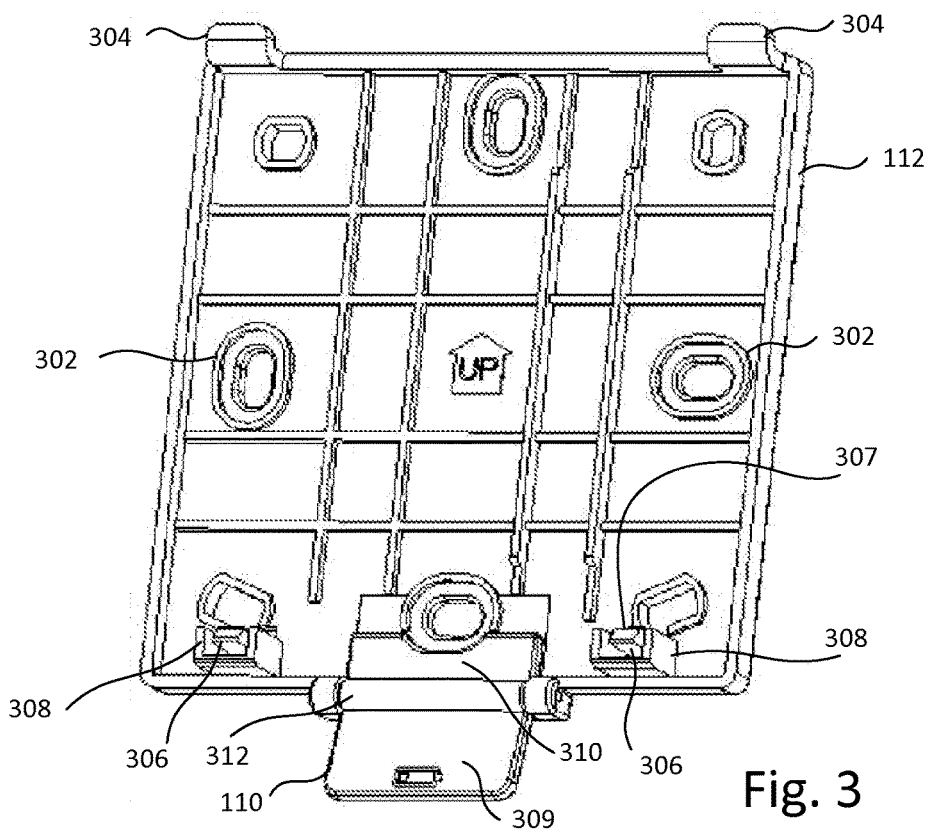
Figure 4:
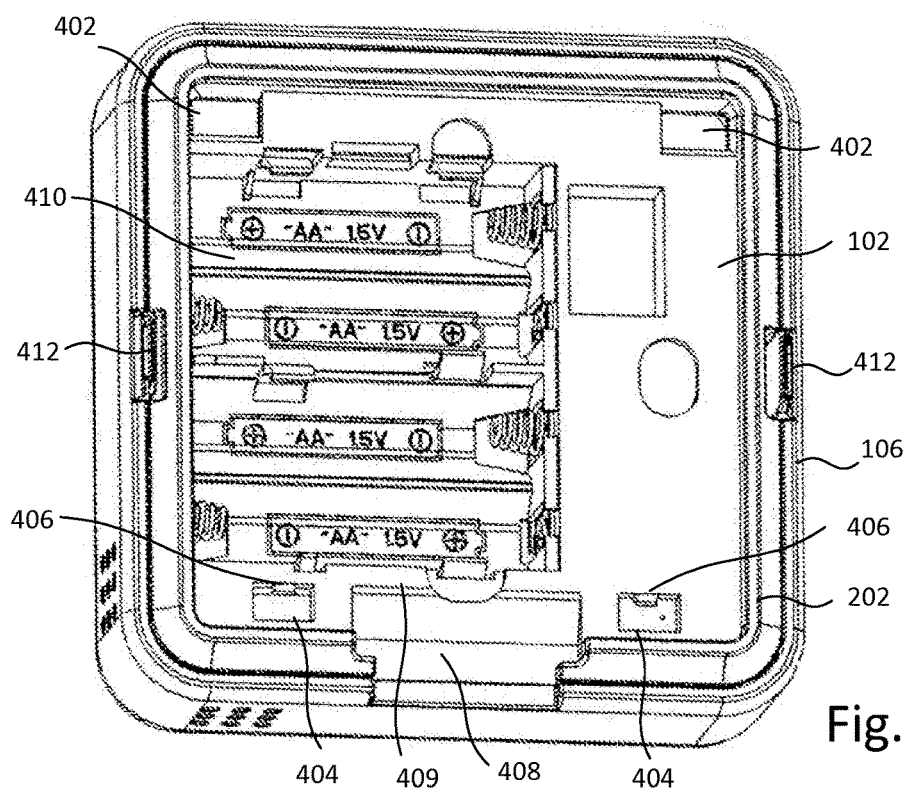
Figure 5:
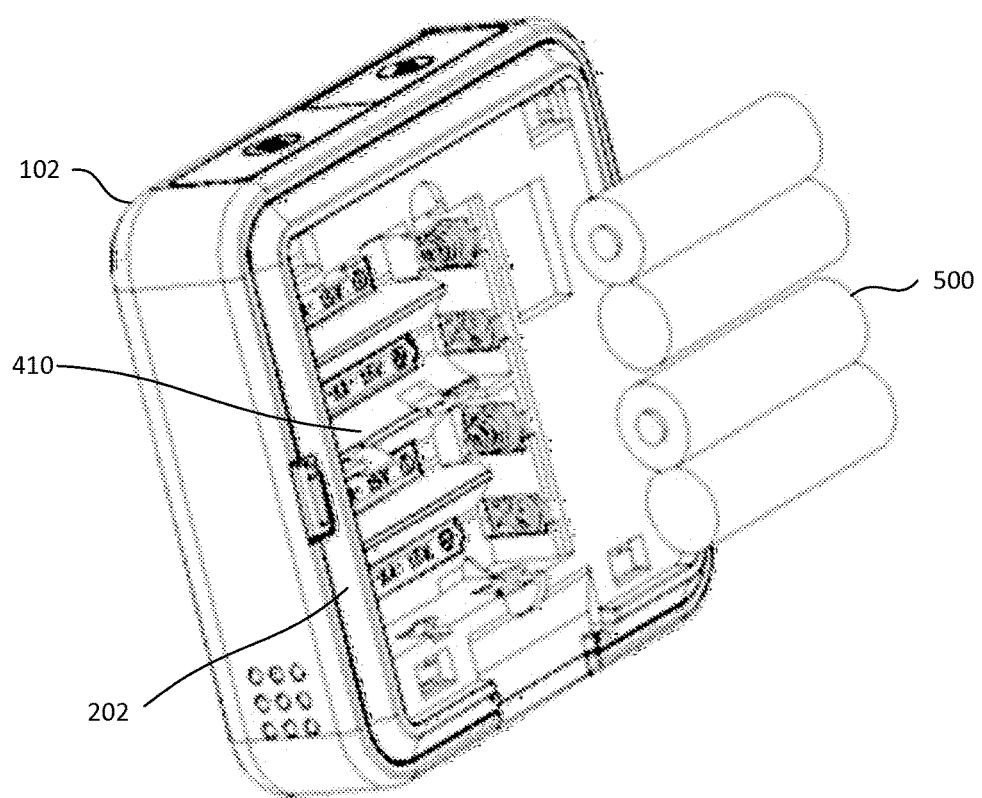
Figure 6:
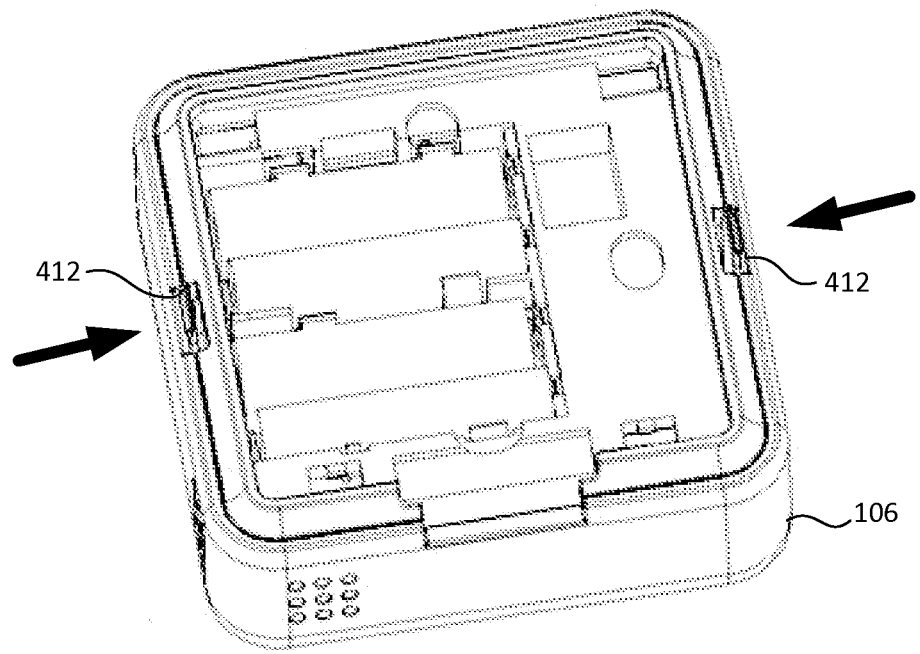
Figure 7:
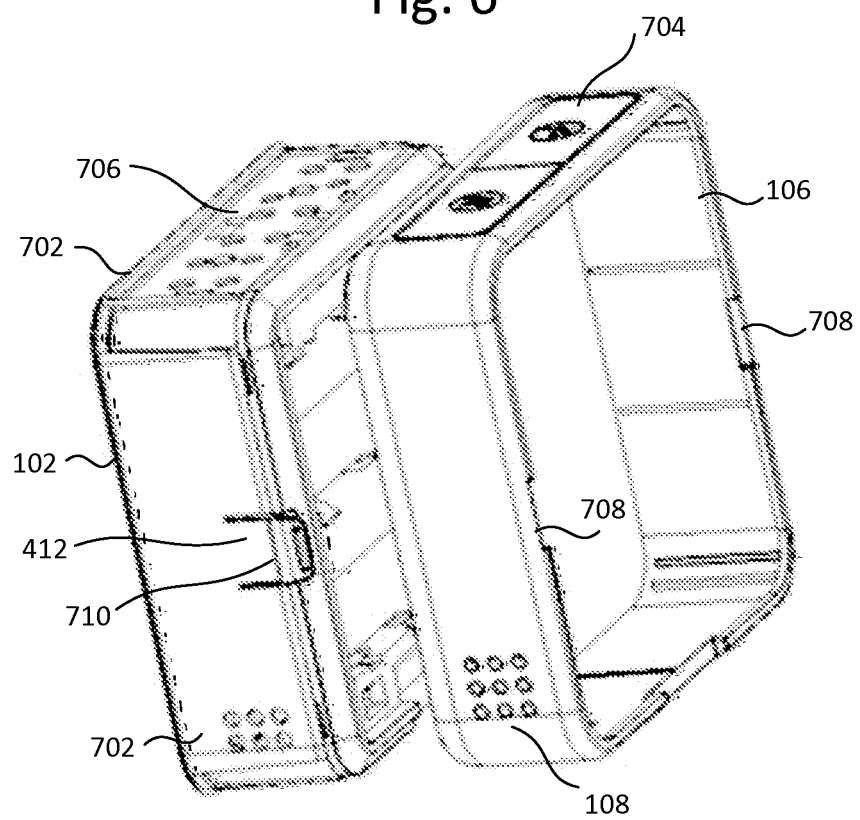

FIG. 1 shows a wireless thermostat;
FIG. 2 is a side view of the thermostat;
FIG. 3 shows a mounting plate;
FIG. 4 shows a rear view of the main body of the thermostat;
FIG. 5 illustrates removal and replacement of batteries; and
FIGS. 6 and 7 illustrate a removable cover.

DETAILED DESCRIPTION

The invention extends to methods and/or apparatus substantially as herein described with reference to the accompanying drawings.

Any feature in one aspect of the invention may be applied to other aspects of the invention, in any appropriate combination.

In aspects of the invention, the disengaging of the securing elements and releasing of the main body preferably occurs in response to a single user action (operation of the lever). The lever is preferably further operable when activated to separate the main body from the mounting plate. The term "separate" should not be taken to necessarily mean full removal, but rather "separate" preferably means that (at least part of) the main body is moved away from (at least a corresponding part of) the mounting plate. In preferred embodiments, the main body pivots away slightly from the mounting plate (e.g. on hooks) when the lever is operated and thus remains connected to the mounting plate at least initially (at the pivot). The main body may or may not be fully removable from the mounting plate.

The support surface is typically a wall or other upright surface, but the mounting plate could alternatively be fixed to a ceiling or any suitable surface.

The periphery of the device beyond which the lever extends is preferably a side surface of the device. Generally (unless context requires otherwise), the term "side surface", "side face", "side wall" or the like as used herein should be understood to refer to exterior surfaces of the device that join (typically orthogonally) a rear face against which the device is mounted to the wall and a user-facing front face (e.g. including controls, a display and the like). A substantially rectangular design would then have four side walls, but other shaped designs may have different numbers of side walls (e.g. a single circular side wall for a round shape).

The lever, being disposed on one of the mounting plate and the main body, is preferably arranged when activated to push against the other of the mounting plate and the main body, thereby pushing the mounting plate and main body apart.

The lever is preferably disposed on (e.g. fixed or integral to) the mounting plate, in which case the main body may include a recessed area arranged to accommodate the lever. For a secure fit, a rear face of the main body may include a raised rim around its periphery arranged to form a recess for receiving the mounting plate, and optionally having a cut-out formed in the rim to accommodate the lever.

Preferably, a first end portion of the lever including the portion extending beyond the periphery of the device to be operable by a user, is angled with respect to a second end portion of the lever such that, when the second end portion is parallel to the mounting plate, the first end portion is angled away from the plane of the mounting plate (preferably towards the user/away from the support surface or wall). This provides space for the lever to be pushed towards the wall whilst allowing a compact construction of the mounting plate. The two end portions preferably extend from (respective sides of) a pivot axis of the lever. Placement of the main body against the mounting plate preferably forces the second end portion to lie flat against the mounting plate, thereby raising the user-operable portion away from the wall.

Preferably, the lever is arranged to extend beyond a first side of the device to be operable by a device user, the securing elements comprising one or more securing elements arranged at, adjacent or near said first side. This can make it easier to use the lever to disengage the securing elements.

The complementary securing elements preferably comprise one or more latch elements formed on one of the mounting plate and the main body and one or more corresponding apertures (or other complementary formations for catching the latch elements) formed in the other one of the mounting plate and the main body, with the latch elements preferably arranged to engage the apertures.

The main body may have a substantially rectangular shape, the device comprising at least two latch elements with corresponding apertures (or other formations), preferably substantially equally spaced from two opposing sides of the device, the two opposing sides preferably perpendicular to a first side from which the lever extends. The terms "rectangular" and "substantially rectangular" as used herein are intended to encompass square shapes, and include shapes having rounded corners.

The, or each, latch element preferably comprises a resilient latch projection resiliently engageable in a corresponding aperture (or against a corresponding formation). Operation of the lever is preferably arranged to overcome the resilient engagement thereby disengaging the latch projection from the aperture or formation. The one or more latch elements are preferably formed on the mounting plate and the apertures or formations are preferably formed in the main body (e.g. in a rear housing wall of the main body).

Preferably, the lever is disposed at a first side of the device (that is, extending from a first side wall) and the main body is adapted, when the lever is operated, to pivot away from the mounting plate along a second side of the device opposite to the first side.

Preferably, the lever is disposed at a first side of the device, the main body, when secured on the mounting plate, being loosely and/or pivotably coupled to the mounting plate at a second side opposite the first side. For example, the mounting plate may comprise one or more rigid projections or hooks formed at the second, opposite, side of the device for insertion into corresponding further apertures in the main body. After operation of the lever to disengage the securing means (which are preferably located at the same side as the lever), the main body can therefore preferably be lifted clear of the mounting plate, e.g. by lifting the main body off the hooks. This provides a convenient and easy quick-release mechanism for removal of the main body from the mounting plate.

For convenient access, the battery compartment may be formed as one or more uncovered recesses in the main body arranged to receive one or more batteries, so as to be immediately accessible once the main body is removed from the mounting plate.

The device is preferably a heating system control/sensor device (e.g. thermostat) for controlling an environmental heating and/or hot water system.

The main body may comprise a removable cover, preferably wherein the main body is mountable to the mounting plate against a rear face of the main body, the removable cover forming one or more other faces of the device.

This feature may also be provided as an independent aspect of the invention. Accordingly, in a further aspect of the invention, there is provided an environmental control and/or sensor device (preferably as above a heating system control/sensor device for controlling an environmental heating and/or hot water system), comprising: a main body having a user-facing front face, a rear face arranged to be mounted to a support surface and a side surface joining the front and rear faces; and a removable cover adapted to be releasably secured to the main body, the removable cover arranged to cover at least a portion of the side surface when secured to the main body.

The removable cover preferably forms one or more side faces of the device, but preferably not the front or rear face.

Thus, the main body may include a fixed front face, preferably including one or more control elements and/or display/indicator elements, and wherein the removable cover preferably does not cover the front face. The fixed face is thus preferably non-removable (at least during ordinary use). The term "front face" as used herein preferably refers to a user-facing face of the device, which is typically substantially parallel to the support surface (e.g. wall) on which the device is mounted. Alternatively or additionally, the removable cover may include the front face and/or a rear face of the device.

The removable cover is preferably in the form of a sleeve adapted to cover the side surface preferably around substantially the entire periphery of the main body. For example, in the case of a circular/oval device shape the sleeve may be in the form of a circular/oval side wall extending around the full periphery of the device. Alternatively, the main body may be substantially rectangular and the removable cover may be in the form of a substantially rectangular sleeve adapted to form the four side faces of the device by covering respective side faces of the main body.

The sleeve is preferably removable by sliding the sleeve parallel to the side face(s) of the main body. The removable cover preferably includes one or more apertures or air vents arranged to be aligned with and/or lie adjacent corresponding air vents on the main body when the cover is secured to the main body, to allow air flow through the cover into or out of the main body (e.g. to a temperature sensor). The removable cover may comprise one or more control elements aligned with, and arranged to engage corresponding control components on the main body when the cover is secured to the main body. For example, the cover may comprise one or more buttons arranged to engage corresponding button sensors or switches on the main body.

The main body and the removable cover preferably include complementary securing elements arranged to secure the cover to the main body. The complementary securing elements may include one or more resilient latch elements, preferably formed on the main body, arranged to engage one or more corresponding formations, such as catches, recesses or apertures, preferably formed on the removable cover. The cover is preferably releasable by flexing the latch elements (e.g. by the user pressing them) to disengage them from the formations in the cover (e.g. allowing the cover to be slid over the latch elements and off the main body). A latch element preferably includes a portion extending beyond an edge of the sleeve to facilitate pressing by the user.

In a further aspect of the invention, there is provided a cover or sleeve for use with a device as set out above. More particularly, there is also provided a removable sleeve for an environmental control and/or sensor device, the device having a main body with a user-facing front face, a rear face for mounting to a support surface and a side surface joining the front and rear faces, the sleeve arranged to be releasably secured to the main body of the device so as to cover the side surface preferably around substantially the entire periphery of the main body. The sleeve may have any of the features of the removable cover as set out above or elsewhere herein.

Embodiments of the present invention provide a battery-powered environmental control and/or sensor device, such as a thermostat. The device includes a housing that affords simple and convenient access to a battery compartment to allow batteries to be replaced. Embodiments also provide a device with a removable sleeve, for example to allow modification of an external appearance of the device.

FIG. 1 depicts a perspective view of an environmental control/sensor device 100, which in this embodiment takes the form of a wireless thermostat for control of a central heating system and/or hot water system.

The device 100 includes a main body 102 which houses interior components of the thermostat, including a battery compartment. The housing of the main body includes a front face 104 with thermostat control features such as buttons, dials, indicators or a display, and the like. The housing also includes a removable cover 106, which will described in more detail below.

The main body 102 is releasably mounted on a mounting plate 112, and a quick-release mechanism is provided to enable easy removal of the main body from the mounting plate, by activation of a lever 110.

FIG. 2 shows a side view of the device, in which the main body 102 has been released and separated from the mounting plate 112 by pressing the lever 110 in the direction indicated by the arrow.

FIG. 3 shows the mounting plate 112 in more detail and FIG. 4 shows a rear view of the main body 102.

Referring to FIG. 3, the mounting plate 112 includes an arrangement of apertures (e.g. 302) to enable the mounting plate to be secured to a wall or other surface by way of screws, nails, hooks or other suitable fastening or hanging means. As an alternative, the back plate may be secured to a wall or other surface using any other attachment means, such as adhesive strips or the like.

The mounting plate includes curved or angled tabs 304 arranged on a top edge of the mounting plate, forming hooks for insertion into corresponding apertures 402 in the main body 102. Additionally, resilient latch projections 306 are arranged near a lower edge of the mounting plate (extending outwardly from the plate) for insertion into corresponding apertures 404 in the main body 102. Each projection has an upwardly facing tooth 307 and is resiliently engageable in corresponding aperture 404, where the tooth hooks a small projection 406 extending into the aperture 404, thereby securing the main body to the mounting plate. The underside of each tooth includes a ramp which acts to flex the latch projection downwards upon insertion, thereby facilitating press-fitting the body to the mounting plate. Rigid sleeves 308 partially surround the latch projections 306 and serve as insertion guides whilst also ensuring secure and rigid coupling of the main body to the mounting plate.

While a particular arrangement of tabs 304 (e.g., forming hooks) at the upper edge and latch projections at the lower edge of the mounting plate are shown, other types (and numbers) of securing elements may be used and the securing elements may be arranged at different locations on the mounting plate and/or main body.

The mounting plate fits into a recessed space defined by a raised rim 202 formed on the back face of the main body and extending around most of its periphery.

In the illustrated embodiment, the lever 110 is disposed at the lower edge of the back plate. A cut-out region in the rim 202 and recessed area 408 in the main body 102 are provided to accommodate the lever. The lever includes a longer end 309 arranged to extend beyond the device housing when the main body is attached to the mounting plate, as illustrated in FIG. 1, to allow operation by a user. A shorter end 310 extends from the other side of the lever's pivot axis 312 and is angled with respect to the longer end such that, when lying flat against the mounting plate, the longer end 309 is angled away from the supporting wall, to provide the necessary travel to operate the lever. For ease of operation, the lever parts 309 and 310 are formed as wide, oblong tabs extending from the pivot axis.

When the main body is secured to the mounting plate, the flat surface of a ridge 409 adjacent the lever recess 408 pushes the shorter end 310 of the lever flat against the mounting plate, raising the angled longer end 309 away from the supporting wall. When the user then presses down on the protruding longer end 309 of the lever (in the direction indicated by the arrow in FIG. 2, towards the rear of the device and the supporting wall), the shorter end 310 of the lever pushes against the ridge 409, which raises the main body away from the mounting plate 112 and forces the latch projections 306 to flex and disengage from the apertures 404. The main body separates by pivoting on the hooks 304 (as depicted in FIG. 2), and can then be lifted off the hooks and removed from the mounting plate.

Once removed from the mounting plate, the user has access to the battery compartment 410, as shown in FIG. 5, to remove or insert batteries 500. Other features of the device may also be accessible in this manner, such as controls that are not usually accessed during normal operation (e.g. a reset button), or relevant device information (e.g. a serial number or media access control (MAC) address).

The described arrangement thus allows the main body to be removed from the mounting plate by simply pressing lever 110 and lifting the main body off the mounting plate. The single action of pressing the lever acts both to disengage the latch projections and separate the main body from the mounting plate so that it can be directly lifted off in a simple motion, which is convenient for the user and easy to accomplish even for less dexterous users.

The described construction also reduces stress on the mounting plate fixings when removing the thermostat to replace the batteries. In many cases fixings are not as secure as they might be, especially if the wall is plasterboard or old plaster, so that conventional arrangements that stress the fixings (such as simply pulling the device off a set of snap clips) can soon result in the mounting plate coming loose. The described lever arrangement, on the other hand, separates the main body from the mounting plate without generating forces that act on the mounting plate fixings.

While in the above embodiment the lever is situated on the backing plate, in other embodiments the lever may be formed on the main body. The lever may be arranged to be operated by a pull rather than a push action. Furthermore, instead of being completely removable (with the main body seated on, and loosely coupled to, the backing plate using tabs or hooks 304 as depicted in FIGS. 3 and 4), the body may be fixed to the back plate via a hinge or other pivoting arrangement, such that the user merely pivots the body away from the back plate to gain access without removing it completely. In this case, the hinge and lever may be arranged on opposite vertical edges instead of opposite horizontal edges as shown.

More generally, while shown with the lever at the bottom edge, the lever could alternatively be arranged at the top or at one of the sides, and the hooks 304 (or other securing, hinge or pivoting mechanism) could then be situated on the opposite side (or indeed any other side).

FIGS. 6 and 7 illustrate the removable cover 106. The removable cover is in the form of a frame or sleeve which, when in place, lies flush against a protruding lip 702 around the front of the main body 102 and forms the upper, lower, left-hand and right-hand side walls of the device. The cover is secured by clips 412 at the rear of the main body 102 which clip into recesses 708 formed at the rear edged of the cover. The clips are in the form of resilient tabs which on their outward-facing surfaces have transverse protruding ribs 710 to engage the recesses 708 so as to hold the cover securely in place.

Pressing the tabs 412 inwards as shown by the arrows in FIG. 6 releases the tabs from recesses 708. Whilst holding the tabs in, the cover can then be slid towards the rear and off the main body 102 as shown in FIG. 7. The cover is similarly replaced by sliding it back over the tabs 412 and main body 102 (which flexes the tabs 412 inwards), until the tabs clip back into the recesses 708.

The clips could alternatively be located on the cover with complementary recesses or apertures on the main body. While two clips are shown on opposing sides, other arrangements with any number of clips can be used. Furthermore, any other suitable mechanisms for securing and releasing the cover may alternatively be used.

The arrangement shown requires the main body 102 to have been removed from the mounting plate first, before the cover 106 can be removed; in an alternative arrangement, the cover arrangement could be reversed so that the cover is removable to the front of the device, which may then not necessitate first removing the main body from the mounting plate.

The cover 106 includes air vents 108 which are aligned with corresponding vents 712 on the inner body, to allow air flow to a temperature sensor located inside the main body housing. Furthermore, control buttons 704 provided on the cover are aligned with button sensors 706 (e.g. switches) on the inner body, such that, when the cover is in place, the button sensors can be activated by the buttons to operate functions of the device.

Removal of the cover can provide additional access to interior parts of the thermostat, for example for maintenance purposes, to access less frequently used controls (e.g. a reset button) and the like.

Furthermore the swappable cover can allow the external appearance of the device to be modified, for example to match a wall colour or other colours or textures in a room where the device is situated.

Thus, replaceable covers of different materials, colours and/or with different surface textures and decorations may be provided, such as chrome effect or wood effect covers. This allows the device to be matched to the décor of the space in which it is installed.

While the embodiment depicted in the drawings includes both the releasable mounting plate feature and the replaceable cover feature, these features may be implemented individually as well as in combination.

The main body housing, mounting plate, and removable cover may be formed from any suitable materials. For example, they may be injection moulded from suitable plastics materials.

It will be understood that the present invention has been described above purely by way of example, and modification of detail can be made within the scope of the invention.

The invention claimed is:

1. An environmental control and/or sensor device, comprising:
   a main body having a user-facing front face, a rear face arranged to be mounted to a support surface via a mounting plate and a side surface joining the front and rear faces; and
   a removable cover adapted to be releasably secured to the main body, the removable cover arranged to cover at least a portion of the side surface when secured to the main body;
   wherein the removable cover is in the form of a sleeve adapted to cover the side surface,
   wherein removal of the sleeve requires the main body to have been removed from the mounting plate, and
   wherein the sleeve is removable by sliding the sleeve parallel to the side face(s) of the main body and towards the rear of the main body.

2. A device according to claim 1, wherein the removable cover forms one or more side faces of the device.

3. A device according to claim 1, wherein the main body includes a fixed front face, preferably including one or more control elements and/or display elements, and wherein the removable cover does not cover the front face.

4. A device according to claim 1, wherein the removable cover is adapted to cover the side surface around substantially the entire periphery of the main body.

5. A device according to claim 1, wherein the main body is substantially rectangular and wherein the removable cover is in the form of a substantially rectangular sleeve adapted to form the four side faces of the device by covering respective side faces of the main body.

6. A device according to claim 1, wherein the removable cover includes one or more control elements respectively comprising a buttons arranged to engage corresponding control components respectively comprising a button sensors on the main body when the cover is secured to the main body.

7. A device according to claim 1, wherein the main body and the removable cover include complementary securing elements arranged to secure the cover to the main body, wherein the complementary securing elements include one or more resilient latch elements, preferably formed on the main body, arranged to engage one or more corresponding formations, such as catches, recesses or apertures, preferably formed on the removable cover, the cover being releasable by flexing the latch elements to disengage them from the formations in the cover.

8. A removable sleeve for an environmental control and/or sensor device, the device having a main body with a user-facing front face, a rear face for mounting to a support surface via a mounting plate and a side surface joining the front and rear faces, the sleeve arranged to be releasably secured to the main body of the device so as to cover the side surface
   wherein removal of the sleeve from the device requires the main body to have been removed from the mounting plate, and
   wherein the sleeve is removable by sliding the sleeve parallel to the side face(s) of the main body and towards the rear of the main body.

9. A device according to claim 1, wherein the removable cover includes one or more apertures or air vents arranged to be aligned with and/or lie adjacent corresponding air vents on the main body when the cover is secured to the main body, to allow air flow through the cover into or out of the main body.

10. A device according to claim 9, wherein the one or more corresponding air vents on the main body are located on the side surface of the main body.

11. A device according to claim 1, wherein the main body has a protruding lip around the front, and the sleeve is adapted to lie flush against the protruding lip when in place.

* * * * *